United States Patent [19]

Jain

[11] Patent Number: 4,835,086

[45] Date of Patent: May 30, 1989

[54] POLYSULFONE BARRIER LAYER FOR BI-LEVEL PHOTORESISTS

[75] Inventor: Sangya Jain, Bridgewater, N.J.

[73] Assignee: Hoechst Celanese Corporation, Somerville, N.J.

[21] Appl. No.: 156,353

[22] Filed: Feb. 12, 1988

[51] Int. Cl.$^4$ .................. G03C 1/52; G03C 1/68; G03C 1/86; G03C 1/94

[52] U.S. Cl. .................. 430/312; 430/326; 430/328; 430/156; 430/166; 430/325

[58] Field of Search ............. 430/156, 166, 312, 325, 430/326, 328, 296, 967, 313

[56] References Cited

U.S. PATENT DOCUMENTS

| | | | |
|---|---|---|---|
| 4,011,351 | 3/1977 | Gipstein et al. | |
| 4,024,305 | 5/1977 | Alpaugh et al. | |
| 4,087,569 | 5/1978 | Hatzakis et al. | |
| 4,156,745 | 5/1979 | Hatzakis et al. | |
| 4,211,834 | 7/1980 | Lapadula et al. | 430/326 |
| 4,217,407 | 8/1980 | Watanabe et al. | 430/166 |
| 4,272,561 | 6/1981 | Rothman et al. | 427/84 |
| 4,289,845 | 9/1981 | Bowden et al. | 430/296 |
| 4,396,458 | 8/1983 | Platter et al. | 156/643 |
| 4,456,675 | 6/1984 | Anderson, Jr. et al. | |
| 4,519,872 | 5/1985 | Anderson, Jr. et al. | 156/643 |
| 4,599,243 | 7/1986 | Sachdev et al. | 427/38 |
| 4,745,042 | 5/1988 | Sasago et al. | 430/280 |

FOREIGN PATENT DOCUMENTS 0031463 7/1981 European Pat. Off.

OTHER PUBLICATIONS

IBM Technical Disclosure Bulletin, vol. 26, No. 11, Apr. 1984, p. 6141.

Primary Examiner—Paul R. Michl
Assistant Examiner—Thorl Chea
Attorney, Agent, or Firm—Richard S. Roberts

[57] ABSTRACT

A photosensitive article which comprises a substrate, a first light sensitive layer on the substrate, a polysulfone layer and a second light sensitive layer. The first light sensitive layer preferably comprises a depolymerizable polymethyl methacrylate polymer and the second light sensitive layer preferably comprises on o-quinone diazide in admixture with a water insoluble, aqueous alkaline soluble binder resin.

21 Claims, No Drawings

POLYSULFONE BARRIER LAYER FOR BI-LEVEL PHOTORESISTS

BACKGROUND OF THE INVENTION

The present invention relates to a photoresist article having enhanced image contrast.

It is well known in the art to produce conventional photoresist formulations such as those described in U.S. Pat. Nos. 3,666,473, 4,115,128 and 4,173,470, which are incorporated herein by reference. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The ability of a resist to reproduce very small dimensions, on the order of a micron or less, is extremely important in the production of large scale integrated circuits on silicon chips and similar components. Circuit density on such a chip can only be increased, assuming the same photolithographic techniques are employed, by increasing the resolution capabilities of the resist. O-quinone diazide sensitized phenol-formaldehyde resists have high sensitivity and submicron resolution when the resist layer thickness is sufficiently small that diffraction and absorption effects do not limit resolution. Thick resist layers of this type (greater than one micron) have a high aspect ratio and a much reduced resolution due to optical diffraction and absorption effects.

When pattern exposure of a photoresist, such as a o-quinone diazide sensitized phenol-formaldehyde resist, is done optically, the high numerical aperture lenses have limited use because of their narrow depth of focus, necessitating the use of thin films. It is practical to use an electron beam but resolution is limited by scattering effects. Exposure by contact printing also avoids the depth of focus problem but it involves other disadvantages. Contact printing tends to scratch masks, so that contact masks have a short life and should be more durable than masks fabricated for projection printing. Proximity printing rather than contact printing extends the life of the mask but diffraction effects are worse. Diffraction effects may be reduced somewhat by reducing the wavelength of the exposure light but this type of improvement is ultimately limited by the light sensitivity and absorption characteristics of the resist. Because of these problems it has not been practical generally to fabricate sufficiently high resolution thick masks from diazo sensitized phenol-formaldehyde resins.

In order to reduce the wavelength of exposure light a class of deep u.v. sensitive resists is known. Such may be composed of radiation degradable alkyl acrylate or methacrylate polymers.

Such resists and their use are described for example in U.S. Pat. Nos. 3,538,137; 3,934,057 and 3,984,582 which are hereby incorporated by reference. Alkyl methacrylate polymers such as polymethyl methacrylate and copolymers are typically patternwise exposed by u.v. radiation or electrons. These resin systems require large exposure doses, therefore imaging time is very large and throughput low.

Alkyl methacrylate polymers are degradable with other high energy radiation as well. X-ray radiation in the 5 angstrom to 50 angstrom range produces a particularly sharp edge and a very high aspect ratio is possible with this type of radiation. However, computer controlled direct writing with x-ray radiation is not practical with current technology and projection printing with x-ray radiation is not technically feasible. Contact printing and proximity printing can be done with x-ray radiation but good materials for fabricating suitable masks are not available.

Alkyl methacrylate polymer resist layers may also be selectively degraded by patterned exposure to deep ultraviolet light at a wavelength of less than 3000 angstroms. Direct writing is again not practical while projection exposure limits resolution. Contact exposure masks may be formed but such layers are difficult to form uniformly.

It is also known that contrast may be enhanced by forming the so-called portable conformable masks or contrast enhancement layer photoresists. By this method, a positive working photoresist layer is applied to a substrate and on this is a second photosensitive layer is imaged to create a photomask which is intimately adhered to the lower photoresist for a second exposure. This close mask contact reduces diffraction thus increasing contrast.

Generally any two photosensitive layers, one spun on top of the other, will cause intermixing between the layers, in particular when both resists are organic solvent based. In order to avoid this intermixing a barrier layer is introduced between the two photosensitive layers, such that the solvent used to spin on the barrier layer does not dissolve the bottom resist and the solvent for the top layer does not dissolve the barrier polymer.

SUMMARY OF THE INVENTION

The invention provides a photoresist article which comprises a substrate and a radiation sensitive layer on said substrate, said radiation sensitive layer comprising a composition selected from the group consisting of a radiation depolymerizable polymer or a photosensitive o-quinone diazide in admixture with a water insoluble, aqueous alkaline soluble binder resin wherein said diazide is present in sufficient amount to render said radiation sensitive layer light sensitive and to provide image differentiation upon imagewise exposure and development of the layer and said resin is present in sufficient amount to bind said layer into a uniform film; and a transparent polysulfone polymer layer on said first light sensitive layer, said polysulfone polymer having the formula.

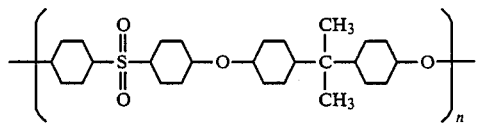

wherein n ranges from about 50 and 80; and a light sensitive layer on said polysulfone layer, said light sensitive layer comprising a photosensitive o-quinone diazide in admixture with a water insoluble, aqueous alkaline soluble binder resin wherein said diazide is present in sufficient amount to render said first light sensitive layer light sensitive and to provide image differentiation upon imagewise exposure and development of the layer and said resin is present in sufficient amount to bind said layer into a uniform film; said light sensitive layer being sensitive to a portion of the spectrum at which said radiation sensitive layer is not sensitive. The invention also provides a method for producing an image which comprises forming the above article, imagewise exposing the light sensitive layer to imaging energy, removing the exposed areas of said light sensitive layer with an aqueous alkaline developer, removing the portions of the polysulfone layer underlying said imaged areas with a solvent which does not remove substantial portions of the radiation or light sensitive layers, imagewise exposing the radiation sensitive layer to sufficient imaging energy to which the non-image areas of the photosensitive layer are substantially non-transmitting, and then removing the image areas of the radiation sensitive layer.

DETAILED DESCRIPTION OF THE PREFERRED EMBODIMENT

The radiation sensitive layer of this invention may be composed of a radiation depolymerizable component. Such are per se known in the art as exemplified by U.S. Pat. Nos. 4,087,569; 4,156,745; 4,011,351 and 4,211,834 which are incorporated herein by reference. In the alternative it may be composed of a known o-quinone diazide photosensitizer in admixture with an aqueous alkaline soluble, water insoluble resin.

In the preferred embodiment, the radiation sensitive layer is composed of a polymerized alkyl methacrylate containing polymer wherein the alkyl group contains from 1 to 4 carbon atoms.

Exemplary of suitable alkyl methacrylate units in the polymeric material are methyl methacrylate, and t-butyl methacrylate of which methyl methacrylate is preferred. Mixtures of the alkyl acrylate can be employed if desired. One preferred material is Elvacite 2041 available from DuPont.

Generally the polymer materials employed according to the present invention have a number average molecular weight in the range of about $5 \times 10^3$ to about $1500 \times 10^3$ and preferably in the range of about $20 \times 10^3$ to about $1,000 \times 10^3$ and have a weight average molecular in the range of about $10 \times 10^3$ to about $3000 \times 10^3$ and preferably in the range of about $40 \times 10^3$ to about $200 \times 10^3$.

The polymeric materials employed in the present invention are normally coated on a substrate from a solution of the polymeric material in any suitable manner such as by spin casting or dipping, and then dried to remove the volatile matter. The solution of the polymeric material should be compatible with the substrate. The solvents employed should have boiling points below the decomposition point of the polymeric material employed in order to permit removal of the solvent from the cast film by heating.

The determination of a specific solvent system for a particular polymeric material primarily depends upon the chemical identity of the polymeric material and upon the molecular weight and is readily ascertainable.

The polymeric films can be cast in various thicknesses and particularly from about 50 angstroms to about 10 microns. The particular thickness will depend upon the type of processing to be employed. For instance, 0.5 to 2 microns is generally desirable for etch processing.

In addition, it is preferred to prebake the polymeric material film in air or in vacuum at a temperature generally above the glass transition temperature of the polymeric material but below the thermal decomposition temperature of the polymeric material. The prebaking step is intended to remove trace amounts of the solvent employed in the coating step and also to anneal out strains in the polymeric film.

The substrate may be any surface suitable for receiving the first photosensitive layer thereon. However, in the preferred embodiment the substrate comprises one or more components selected from the group consisting of silicon, aluminum, polymeric resins, silicon dioxide, doped silicon dioxide, silicon nitride, tantalum, copper, polysilicon, ceramics, aluminum/copper mixtures, gallium arsenide and other such Group III/V compounds.

The substrate may have an adhesion promoted layer of a suitable composition such as one containing hexaalkyl disilazane.

The polysulfones useful for this invention are high-molecular-weight polymers containing sulfone groups and aromatic nuclei in the main polymer chain.

The polysulfones are clear, rigid, tough thermoplastics with glass-transition temperatures of 180°–250° C. They have the formula

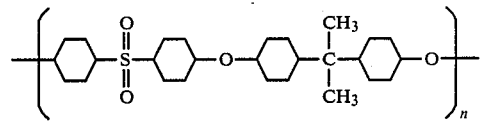

where n has values between 50 and 80 and have excellent thermal stability and chemical inertness. The most preferred polysulfones are P1700 and P3500 available from Union Carbide. They have a preferred average molecular weight in the range of from about 9,000 to about 13,000 and are transparent to light. For this invention, they are dissolved in a suitable solvent such as cyclohexanone or chlorobenzene. The coating solvent should be one which dissolves the polysulfone but which does not dissolve the radiation sensitive layer. The solvent is then evaporated, for example by baking at 130° C. for 30 minutes to obtain a dry coating weight of from about 0.15 to about $0.25\mu$. Substantially thicker coatings will provide an end product resist having undersized slope wall profiles.

On top of the polysulfone layer is applied a per se known photoresist which comprises an o-quinone diazide photosensitizer and a water insoluble, aqueous alkali soluble binder resin. This light sensitive layer must be coated out of a solvent which does not dissolve the polysulfone layer. The o-quinone photosensitizer must also be non-transmissive to energy at which the radiation sensitive layer is sensitive. Suitable binding resins non-exclusively include novolak and polyvinyl phenol polymers. Cresol formaldehyde novolaks are most preferred.

The production of novolak resins, which may be used for preparing photosensitive compositions, is well known in the art. A precedure for their manufacture is described in *Chemistry and Application of Phenolic Resins*, Knop A. and Scheib, W.; Springer Verlag, New York, 1979 in Chapter 4 which is incorporated herein by reference. Similarly, the use of o-quinone diazides is well known to the skilled artisan as demonstrated by *Light Sensitive Systems*, Kosar, J.; John Wiley & Sons, New York, 1965 in Chapter 7.4 which is also incorporated herein by reference. These sensitizers which comprise a component of the present U.V. resist compositions of the present invention are selected from the group of substituted napthoquinone diazide sensitizers which are conventionally used in the art in positive photoresist formulations. Such sensitizing compounds are disclosed, for example, in U.S. Pat. Nos. 2,797,213; 3,106,465; 3,148,983, 3,130,047, 3,201,329; 3,785,825; and 3,802,885. Useful photosensitizers include naphthoquinone-(1,2)-diazide-5-sulfonyl chloride, and naphthoquinone-(1,2)-diazide-4-sulfonyl chloride condensed with phenolic compounds such as hydroxy benzophenones.

In the preferred embodiment, the solid parts of the photoresist composition, that is the novolak and diazide, preferably ranges from 15% to about 99% novolak resin and from about 1% to about 85% quinone diazide. A more preferred range of novolak resin would be from about 50% to about 90% and most preferably from about 65% to about 90% by weight of the solid resist parts. A more preferred range of the diazide would be from about 10% to about 50% and more preferably from about 10% to about 35% by weight of the solid resist parts.

The choice of solvent depends on the intended coating process, the desired coating thicknesses and the drying conditions. Suitable solvents for the composition of the invention include ethers (e.g. tetrahydrofuran), alcohols (e.g. n-propanol), alcohol-ethers (e.g. ethylene glycol monoethyl ether) (e.g. butyl acetate), aromatic or aliphatic hydrocarbons (e.g. xylene) or mixtures of solvents may also be used. In principal, all solvents which do not react irreversibly with the components of the coating nor dissolve the polysulfone layer can be used. Partial ethers of glycols, especially ethylene or proplyene glycol monoethly ether, or their esters are particularly preferred. A preferred solvent composition comprises propylene glycol mono-methyl ether acetate. Solvents may also include xylene, butylacetate and Cellosolve acetate.

Additives such as colorants, dyes, anti-striation agents, plasticizers, adhesion promoters, speed enhancers, solvents and such surfactants as non-ionic surfactants may be added to the solution of resin sensitizer and acetate before the solution is coated onto a substrate.

Examples of dye additives that may be used together with the photoresist compositions of the present invention include Methyl Violet 2B (C.I. No. 42535), Crystal Violet (C.I. No. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used up to five percent weight level, based on the combined weight of novolak and sensitizer.

Plasticizers which may be used include, for example, phosphoric acid tri-(betachloroethyl)-ester; stearic acid; dicamphor; polypropylene; acetal resins; phenoxy resins; and alkyl resins at one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxycyclohexyl)-ethyltrimethoxysilane; p-methyl-disilane-methyl methacrylate; vinyl-tricholorosilane; and gamma-amino-propyl triethoxysilane up to a 4 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

Non-ionic surfactants that may be used include, for example, nonylphenoxy poly(ethyleneoxy) ethanol; octylphenoxy(ethyleneoxy) ethanol; and dinonyl phenoxy poly(ethyleneoxy) ethanol at up to 10 percent weight levels, based on the combined weight of novolak and sensitizer.

The prepared resist solution, can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process.

After the resist composition solution is coated onto the substrate, the substrate is baked at approximately 80° to 105° C. until substantially all the solvent has evaporated and only a thin coating of photoresist composition on the order of 0.5 to 1.5 microns in thickness remains on the substrate.

The light sensitive upper layer is then imagewise exposed to activating energy by a method well known to the skilled artisan. The imaged areas are then removed with a suitable developer such as an aqueous alkaline developer.

One suitable developer is AZ Developer available from the AZ Photoresist Products Group of Hoechst Celanese Corporation, Somerville, N.J.

The polysulfone layer portions which underlie the removed light sensitive layer portions are then removed with a suitable solvent. Such may be any material which removes the opened polysulfone portions but does not remove the light sensitive or radiation sensitive layers. One preferred material is Chlorobenzene.

The radiation sensitive layer is then exposed via an overall flood exposure through the upper light sensitive layer. Exposure may be by electron beam or x-ray but the most preferred exposure is with deep u.v. radiation, i.e. at a wavelength of from about 220-260 nm. It is important that the non-removed light sensitive layer portions not transmit any substantial amount of energy to which the lower radiation sensitive layer is sensitive in order to effectively act as an exposure mask. The exposed lower radiation sensitive layer is removed. In one preferred embodiment depolymerized polymethyl methacrylate is removed with chlorobenzene.

Although in general, the use of o-quinone diazide photosensitizers provide positive working systems, the present invention is not intended to be so limited. The invention also encompasses the so-called image reversal processes wherein, by appropriate additions to the photoresist composition and/or additional processing steps, the o-quinone diazide layer can also produce negative images. Such may be produced by including a crosslinking compound such as a dimethylol paracresol in the photoresist layer.

The following specific examples will provide detailed illustrations of the methods of producing and utilizing the compositions of the present invention. These examples are not intended, however, to limit or restrict the scope of the invention in any way and should not be construed as providing conditions, parameters or values which must be utilized exclusively in order to practice the present invention.

EXAMPLE

The following compositions are formed.
w/w %
Bottom Layer (1)
8.8 Polymethylmethacrylate Elvacite 2041
91.18 Chlorobenzene
0.02 Coumarin dye
Barrier Layer (2)
5 Polysulfone
95 Cyclohexanone
Top Layer (3) 1370
20.8 Cresol formaldehyde resin
6.5 Condensation product of trihydroxybenzophenone and 1,2 naphthaquinone 2 diazide-5-sulfonylchloride
72.7 AZ thinner The bottom PMMA layer is spun at 2000 rpm and baked at 155° C. for 30 minutes. On top of this another layer of PMMA is spun and baked to give a total film thickness of 1.65 μm. The barrier layer is spun at 4000 rpm and baked at 130° C. for 30 minutes to give a barrier film of 0.2 μm. The top layer is spun at 5000 rpm and baked at 85° C. for 30 minutes to give a 1.1 μm film.

The top layer is imaged using a 436 nm stepper and developed in an inorganic alkali developer. The barrier layer is removed in the open areas by dipping the wafer in chlorobenzene for 90 seconds followed by a 20 second toluene rinse. A 1700 mJ deep uv flood exposure is given to depolymerize the polymethylmethacrylate, thus making the exposed area soluble in chlorobenzene, but not removing the top layer or the barrier layer. Line and spaces 1.5 μm apart are easily resolved.

What is claimed is:

1. A photoresist article which comprises
  (i) a substrate; and
  (ii) a radiation sensitive layer on said substrate, said radiation sensitive layer comprising a composition selected from the group consisting of
    (a) a radiation depolymerizable polymer; and
    (b) a photosensitive o-quinone diazide in admixture with a water insoluble, aqueous alkaline soluble binder resin wherein said diazide is present in sufficient amount to render said radiation sensitive layer light sensitive and to provide image differentiation upon imagewise exposure and development of the layer and said resin is present in sufficient amount to bind said layer into a uniform film; and
  (iii) a transparent polysulfone polymer layer directly on said radiation sensitive layer, said polysulfone polymer having the formula:

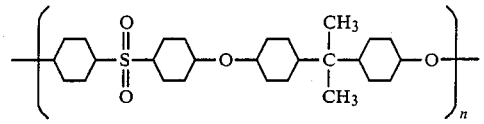

wherein n ranges from about 50 and 80; and
  (iv) a light sensitive layer on said polysulfone layer, said light sensitive layer comprising a photosensitive o-quinone diazide in admixture with a water insoluble, aqueous alkaline soluble binder resin wherein said diazide is present in sufficient amount to render said light sensitive layer light sensitive and to provide image differentiation upon imagewise exposure and development of the light sensitive layer and said resin is present in sufficient amount to bind said light sensitive layer into a uniform film; said light sensitive layer being sensitive to a portion of the spectrum at which said radiation sensitive layer is not sensitive.

2. The article of claim 1 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures, gallium arsenide and Group III/V compounds.

3. The article of claim 1 wherein the radiation sensitive layer comprises a radiation depolymerizable polymer which is a $C_1$ to $C_4$ alkyl methacrylate containing material.

4. The article of claim 1 wherein the radiation depolymerizable polymer is polymethyl methacrylate.

5. The article of claim 1 wherein the radiation sensitive layer comprises and o-quinone diazide in admixture with an aqueous alkali soluble, water insoluble binder resin.

6. The article of claim 5 wherein the radiation sensitive layer comprises a cresol formaldehyde novolak resin, and wherein said diazide is a naphthoquinone-(1,2)-diazide-4 or 5-sulfonyl chloride condensed with a hydroxy benzophenone or hydroxy alkylphenone.

7. The article of claim 1 wherein said polysulfone has a molecular weight in the range of from about 9,000 to about 13,000.

8. The article of claim 1 wherein the light sensitive layer comprises a cresol formaldehyde novolak resin, said diazide is a naphthoquinone-(1,2)-diazide-4 or 5-sulfonyl chloride condensed with a trihydroxybenzophenone.

9. The article of claim 1 wherein said light sensitive layer further comprises one or more additives selected from the group consisting of colorants, anti-striation agents, plasticizers, adhesion promoters, speed enhancers, solvents and surfactants.

10. A method for producing an image which comprises forming a photoresist article which comprises
  (i) a substrate; and
  (ii) a radiation sensitive layer directly on said substrate, said radiation sensitive layer comprising a composition selected from the group consisting of
    (a) a radiation depolymerizable polymer; and
    (b) a photosensitive o-quinone diazide in admixture with a water insoluble, aqueous alkaline soluble binder resin wherein said diazide is present in sufficient amount to render said radiation sensitive layer light sensitive and to provide image differentiation upon imagewise exposure and development of the radiation sensitive layer and said resin is present in sufficient amount to bind said radiation sensitive layer into a uniform film; and (iii) a transparent polysulfone polymer layer directly on said radiation sensitive layer, said polysulfone polymer having the formula:

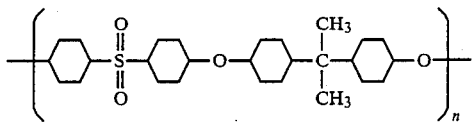

wherein n ranges from about 50 and 80; and (iv) a light sensitive layer directly on said polysulfone layer, said light sensitive layer comprising a photosensitive o-quinone diazide in admixture with a water insoluble, aqueous alkaline soluble binder resin wherein said diazide is present in sufficient amount to render said light sensitive layer light sensitive and to provide image differentiation upon imagewise exposure and development of the light sensitive layer and said resin is present in sufficient amount to bind said light sensitive layer into a uniform film; said light sensitive layer being sensitive to a portion of the spectrum at which said radiation sensitive layer is not sensitive; and then imagewise exposing the light sensitive layer to imaging energy, removing the non-image areas of said light sensitive layer with an aqueous alkaline developer, removing only the portions of the polysulfone layer underlying said non-image areas with a solvent which does not remove substantial portions of the radiation or light sensitive layers, imagewise exposing the radiation sensitive layer to sufficient imaging energy to which the image areas of the light sensitive layer are substantially non-transmitting, and then removing the image areas of the light sensitive layer, the polysulfone layer and the non-image portions of the radiation sensitive layer.

11. The method of claim 10 wherein said solvent comprises chlorobenzene.

12. The method of claim 10 wherein the exposure of the radiation sensitive layer is conducted with x-ray, electron beam or ultraviolet radiation.

13. The method of claim 12 wherein said ultraviolet radiation is at a wavelength of from about 220 to about 260 nm.

14. The method of claim 10 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures, gallium arsenide and Group III/V compounds.

15. The method of claim 10 wherein the radiation sensitive layer comprises a radiation depolymerizable polymer which is a $C_1$ to $C_4$ alkyl methacrylate containing material.

16. The method of claim 10 wherein the radiation depolymerizable polymer is polymethyl methacrylate.

17. The method of claim 10 wherein the radiation sensitive layer comprises an o-quinone diazide in admixture with an aqueous alkali soluble, water insoluble binder resin.

18. The method of claim 17 wherein the radiation sensitive layer comprises a cresol formaldehyde novolak resin, and wherein said diazide is a naphthoquinine-(1,2)-diazide-4 or 5-sulfonyl chloride condensed with a hydroxy benzophenone or hydroxy alkylphenone.

19. The method of claim 10 wherein said polysulfone has a molecular weight in the range of from about 9,000 to about 13,000.

20. The method of claim 10 wherein the light sensitive layer comprises a cresol formaldehyde novolak resin, said diazide is a naphthoquinone-(1,2)-diazide-4 or 5-sulfonyl chloride condensed with a trihydroxybenzophenone.

21. The method of claim 10 wherein said light sensitive layer further comprises one or more additives selected from the group consisting of colorants, anti-striation agents, plasticizers, adhesion promoters, speed enhancers, solvents and surfactants.

* * * * *